United States Patent
Oh et al.

(10) Patent No.: US 10,627,939 B2
(45) Date of Patent: Apr. 21, 2020

(54) TOUCHSCREEN INTEGRATED DISPLAY DEVICE AND METHOD FOR MANUFACTURING THE SAME

(71) Applicant: LG Display Co., Ltd., Seoul (KR)

(72) Inventors: Sang-Hoon Oh, Jeollabuk-do (KR);
Jung-Min Lee, Seoul (KR);
Byoung-Har Hwang, Goyang-si (KR);
Sang-Hak Shin, Goyang-si (KR);
Tae-Hyoung Kwak, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/827,089

(22) Filed: Nov. 30, 2017

(65) Prior Publication Data

US 2018/0150170 A1 May 31, 2018

(30) Foreign Application Priority Data

Nov. 30, 2016 (KR) .................. 10-2016-0162381

(51) Int. Cl.
*G06F 3/041* (2006.01)
*H01L 51/00* (2006.01)
*H01L 51/52* (2006.01)
*H01L 27/32* (2006.01)

(52) U.S. Cl.
CPC .......... *G06F 3/0412* (2013.01); *H01L 27/323* (2013.01); *H01L 51/003* (2013.01); *H01L 51/0097* (2013.01); *H01L 51/5203* (2013.01); *H01L 51/5284* (2013.01); *G06F 2203/04103* (2013.01); *Y02E 10/549* (2013.01)

(58) Field of Classification Search
CPC ... G06F 3/0412; G06F 3/0418; H01L 27/323; H01L 51/003; H01L 51/0097; H01L 51/5284; H01L 51/5246
USPC ..................................................... 345/173
See application file for complete search history.

(56) References Cited

U.S. PATENT DOCUMENTS

| | | | | |
|---|---|---|---|---|
| 9,911,943 | B2* | 3/2018 | Han | H01L 51/5246 |
| 10,454,048 | B2* | 10/2019 | Jeong | G06F 3/0412 |
| 2014/0061597 | A1* | 3/2014 | Choi | H01L 51/5284 |
| | | | | 257/40 |
| 2014/0078077 | A1* | 3/2014 | Choi | H01L 27/323 |
| | | | | 345/173 |
| 2015/0220206 | A1* | 8/2015 | Knausz | G06F 3/0418 |
| | | | | 345/174 |
| 2017/0068128 | A1* | 3/2017 | Lim | G02F 1/133512 |
| 2017/0176827 | A1* | 6/2017 | Kawata | G02F 1/133345 |
| 2018/0004336 | A1* | 1/2018 | Shepelev | G06F 3/0416 |
| 2018/0060641 | A1* | 3/2018 | Kim | G06K 9/00013 |
| 2018/0120998 | A1* | 5/2018 | Jeong | G06F 3/0412 |
| 2018/0146564 | A1* | 5/2018 | Wang | G02B 5/003 |

* cited by examiner

*Primary Examiner* — Fred Tzeng
(74) *Attorney, Agent, or Firm* — Morgan, Lewis & Bockius LLP

(57) ABSTRACT

Provided are a touchscreen integrated display device and a method for manufacturing the same. A touchscreen integrated display device includes: a display panel including: an active area in a center of the active area, and a dead area at a periphery of the active area, a touchscreen including: a transparent organic film corresponding to the active area, and a shielding film surrounding a periphery of the transparent organic film, a first adhesive layer between the display panel and the touchscreen, the first adhesive layer corresponding to the active area, and a polarizing plate on the touchscreen.

15 Claims, 21 Drawing Sheets

TOUCHSCREEN INTEGRATED DISPLAY DEVICE AND METHOD FOR MANUFACTURING THE SAME

CROSS-REFERENCE TO RELATED APPLICATION(S)

This application claims the priority of Korean Application No. 10-2016-0162381, filed on Nov. 30, 2016, the entirety of which is hereby incorporated by reference.

BACKGROUND

1. Technical Field

The present disclosure relates to a display device, more particularly, to a touchscreen integrated display device and a method for manufacturing the same.

2. Discussion of the Related Art

Representative examples of display devices include liquid crystal displays (LCDs), organic light-emitting diodes (OLEDs), plasma display panels (PDPs), quantum dot displays, field emission displays (FEDs), electrophoretic displays (EPDs), and the like. All of these displays include a flat display panel to display an image as an indispensable component, and the flat display panel has a configuration in which a pair of transparent insulation substrates are joined via an inherent light-emitting, polarizing, or other optical material layer, such that the substrates face each other. Thereamong, OLED displays, which can reduce weight through omission of a light source, and which display a variety of colors, have drawn a great deal of attention.

In addition, in accordance with an increased size of recent display devices, demand for configurations capable of reducing the non-display area is also increasing. Such demand accelerates the need for flexible display devices. Accordingly, as the thickness of display devices gradually decreases, flexible display devices, including bendable or rollable display devices, are being developed. Meanwhile, display device needs to further include a touchscreen with a display function, as well as an added touch detection function, to meet specific demands of a user.

Accordingly, an organic light-emitting diode display in which a touchscreen is integrated with an organic light-emitting array has been suggested. The touchscreen is disposed substantially adjacent to a screen that a viewer watches, disposed on an organic light-emitting array. In addition, a sensor electrode is provided in an active region in which a viewer directly conducts touch and routing lines, and pads that apply a signal to the sensor electrode and that detect the signal from the sensor electrode are provided outside the active region. However, because pads and routing lines disposed outside the active region have re-flexibility, there is a problem in which they are viewed based on the viewing angle of a viewer.

SUMMARY

Accordingly, the present disclosure is directed to a touchscreen integrated display device and a method for manufacturing the same that substantially obviate one or more of the issues due to limitations and disadvantages of the related art.

An aspect of the present disclosure is to provide a touchscreen integrated display device and a method for manufacturing the same.

Another aspect of the present disclosure is to provide a touchscreen integrated display device that can prevent lines from being visible outside and at the same time, solve crack propagation during folding or defects forming on return to an original state after bending by changing the configuration of the touchscreen, and a method of manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a touchscreen integrated display device, including: a display panel including: an active area in a center of the active area, and a dead area at a periphery of the active area, a touchscreen including: a transparent organic film corresponding to the active area, and a shielding film surrounding a periphery of the transparent organic film, a first adhesive layer between the display panel and the touchscreen, the first adhesive layer corresponding to the active area, and a polarizing plate on the touchscreen.

In another aspect, there is provided a method for manufacturing a touchscreen integrated display device, the method comprising: providing a first glass substrate; providing a closed loop-shaped shielding film on the first glass substrate; providing a transparent organic film in the shielding film on the first glass substrate; providing a sensor electrode on the transparent organic film; providing a routing line and a pad electrode on the shielding film; providing a display panel comprising: providing an active area corresponding to the transparent organic film; providing a dead area outside the active area; and providing a sub-pad electrode in a region corresponding to the pad electrode in the dead area; providing a first adhesive layer on the transparent organic film, provided with the sensor electrode, to bond the active area of the display panel thereto; removing the first glass substrate; and adhering a polarizing plate to the rear surface of the transparent organic film and the shielding film.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that are included to provide a further understanding of the disclosure and are incorporated in and constitute a part of this application, illustrate embodiments of the disclosure and together with the description serve to explain various principles of the disclosure.

Figure 1:
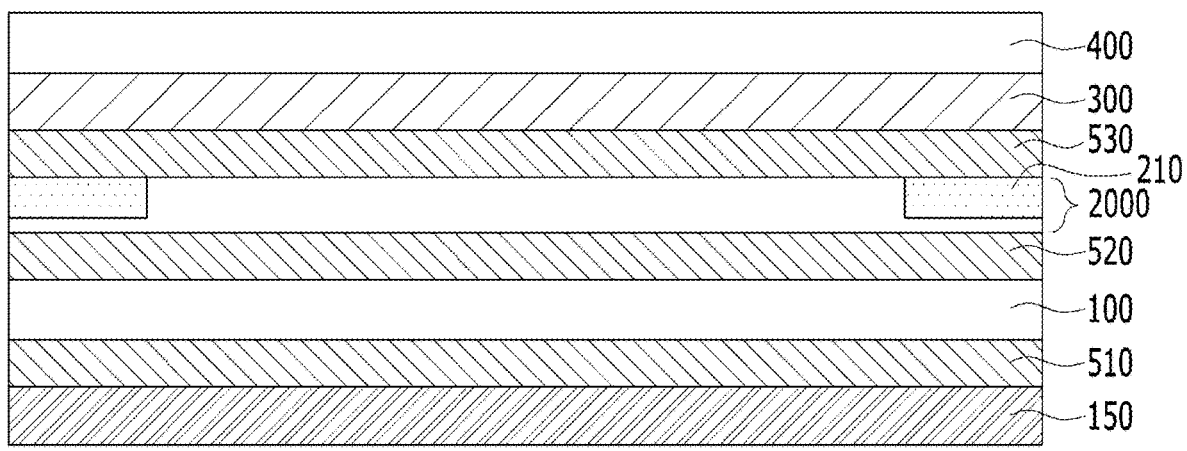
FIG. 1 is a sectional view schematically illustrating a touchscreen integrated display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

FIG. 1 is a sectional view schematically illustrating a touchscreen integrated display device according to an embodiment of the present disclosure.

As shown in FIG. 1, the touchscreen integrated display device according to an embodiment of the present disclosure may include a display panel 100 including an active area AA (see FIG. 2) in the center and a dead area DA (see FIG. 2) outside the active area, a touchscreen 2000 including a transparent organic film 200 corresponding to the active area AA and a shielding film 210 surrounding the active area AA, a first adhesive layer 520 provided between the display panel 100 and the touchscreen 2000 in the active area AA, and a polarizing plate 300 disposed on the touchscreen 2000.

Meanwhile, the polarizing plate 300 may be a film produced during a process separate from the display panel 100, which may have an adhesive surface and a release film attached to the adhesive surface and may be wound on a roll. During the process, when the release film is removed, the adhesive surface may be exposed. For example, when the adhesive surface of the polarizing plate 300 is attached to the cover window 400, and the non-adhesive surface faces the touchscreen 2000, a second adhesive layer 530 may be interposed and attached to the touchscreen 2000. Conversely, when the adhesive surface of the polarizing plate 300 directly faces the touchscreen 2000, the polarizing plate 300 may be attached to the touchscreen 2000 without interposing an adhesive layer between the touchscreen 2000 and the polarizing plate 30. In this case, because the polarizing plate 300 may cover both the transparent organic film 200 and the shielding film 210, the shielding film 210 may not be visible from the outside.

In addition, a third adhesive layer 510 may also be provided on the rear surface of the display panel 100 so that the display panel 100 can be adhered to the back plate 150. The back plate 150 may be a component for supporting the produced slim touchscreen integrated display device. As shown in the drawing, the back plate 150 may be disposed on the rear surface of the display panel 100. However, in some cases, the back plate 150 may surround the side of the display panel 100. Meanwhile, the display panel 100 may not include a hard and thick glass substrate (e.g., about 500 μm to 700 μm), may include a thin film transistor array and an organic diode array on a thin substrate with a thickness of, e.g., about several microns (μm) or several tens of μm, and may have a thickness and flexibility to an extent enabling folding or bending.

The cover window 400 may be a transparent plastic film or a glass film etched to a predetermined thickness which may have impact resistance. In addition, the cover window 400 may be a plane where touch may actually be conducted by a finger or pen. Meanwhile, all of the components of the touchscreen integrated display device according to an embodiment may have a thickness of about 100 μm or less, and may have flexibility to an extent to be foldable or bendable in a stacked structure.

In addition, the touchscreen 2000 may house a shielding film 210. With regard to the relation with upper and lower components, the shielding film 210 may not protrude and may be flush with side components so that the second adhesive layer 530 and the first adhesive layer 520 disposed in upper and lower areas thereof can be evenly adhered to the touchscreen 2000 without a gap or a step.

In addition, reflection visibility by the routing lines and the like can be reduced or completely prevented at different viewing angles because peripheral routing lines or pad electrodes may be directly disposed on the shielding film 210 or may be disposed substantially vertically adjacent thereto during manufacture of the touchscreen. Hereinafter, a configuration of the touchscreen 2000 according to an embodiment will be described in detail.

Figure 2:
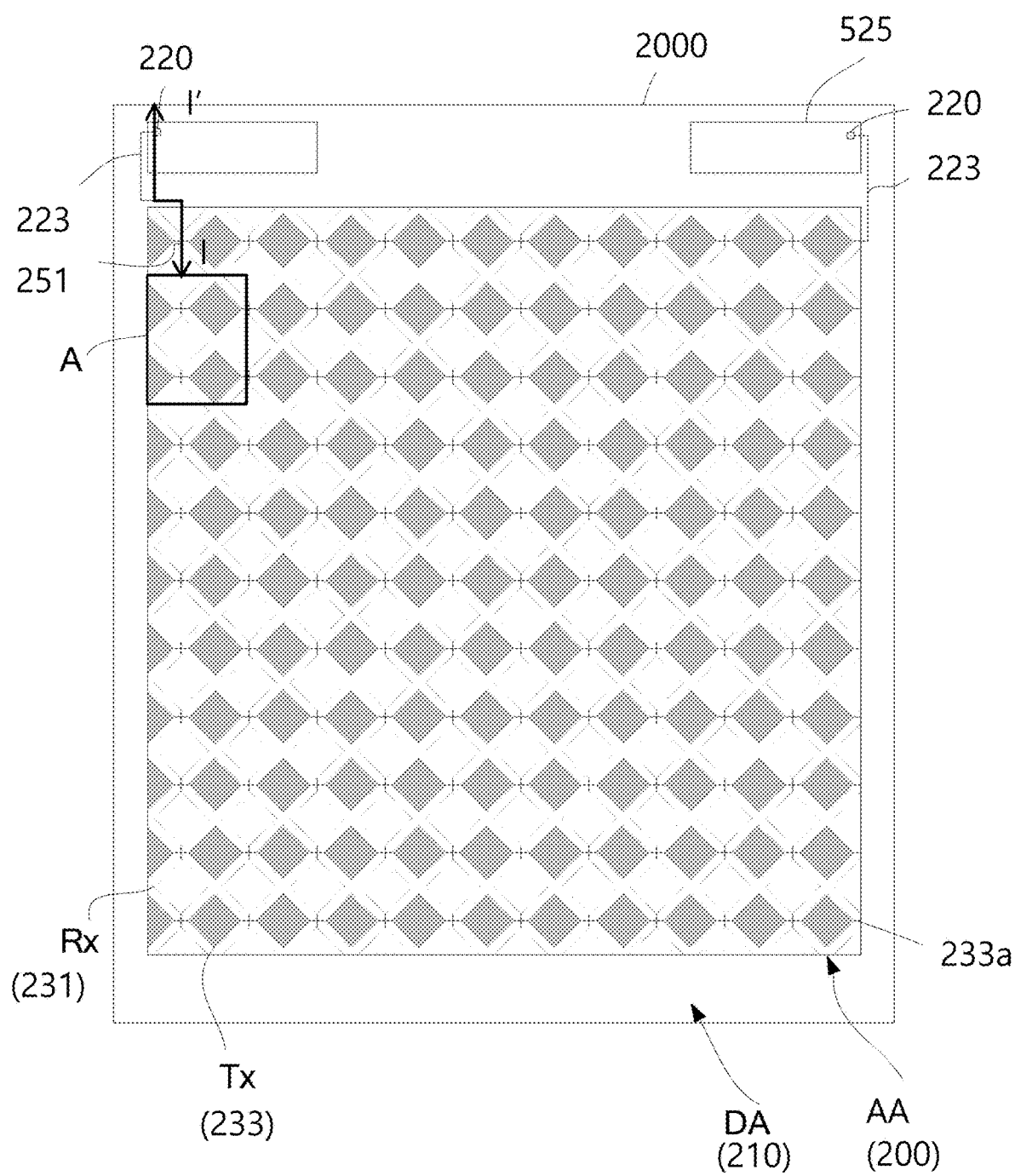
FIG. 2 is a plan view illustrating a touchscreen according to an embodiment of the present disclosure.
Figure 3:
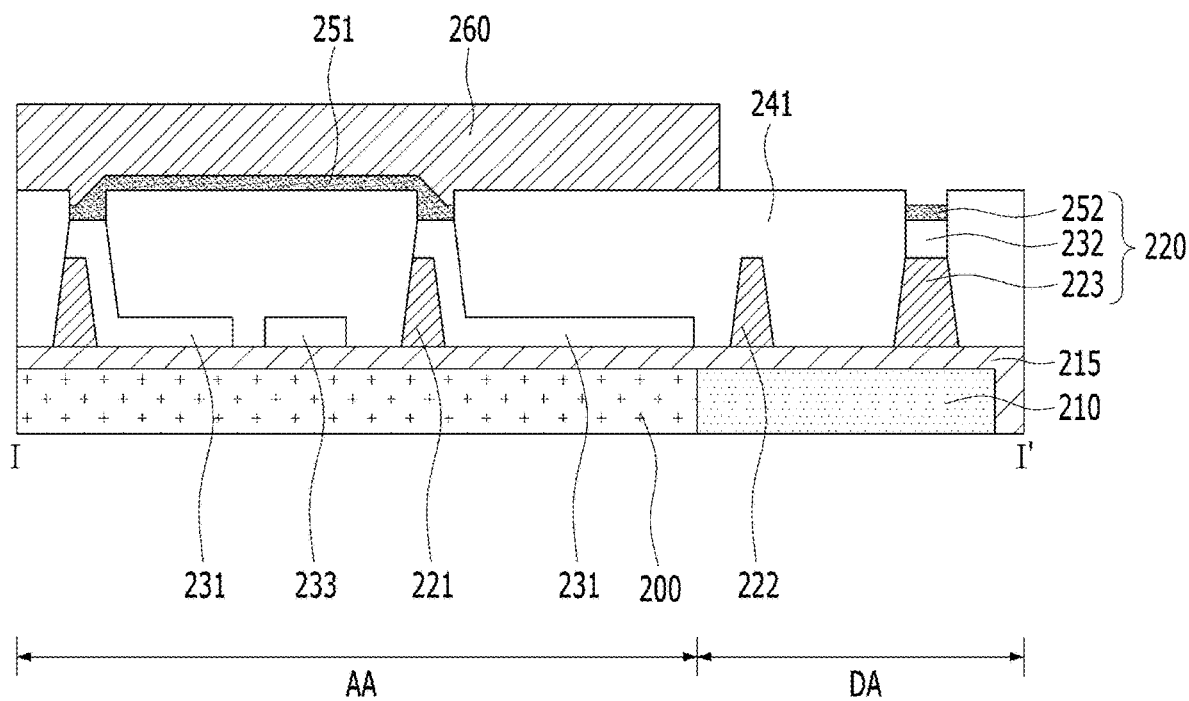
FIG. 3 is a sectional view taken along line I-I' of FIG. 2.

FIG. 2 is a plan view illustrating a touchscreen according to an embodiment of the present disclosure. FIG. 3 is a sectional view taken along line I-I' of FIG. 2.

As shown in FIGS. 2 and 3, the touchscreen 2000 may include the transparent organic film 200 disposed corresponding to the active area AA, a sensor electrode 231 disposed on the transparent organic film 200, and a routing line 222 and a pad electrode 220 disposed on the shielding film 210 corresponding to the dead area DA.

FIGS. 2 and 3 show that the transparent organic film 200 may be disposed in the active area AA, while the shielding film 210 may be disposed in the dead area DA so that the transparent organic film 200 and the shielding film 210 may be separately disposed in the active area AA and the dead area DA, respectively. However, embodiments are not limited to this configuration. For example, the transparent organic film 200 may cover the entire surface of the active area AA, and may furthermore extend to a part of the dead area DA. The shielding film 210 may be provided (or formed) only in a part of the dead area DA, so long as it is large enough to shield the routing line 222 and the pad electrode 220.

The transparent organic film 200 and the shielding film 210 may contact each other at the sides thereof. The transparent organic film 200 and the shielding film 210 may have a step-free surface, and may have the same thickness.

In addition, a buffer layer 215 covering the surface of the transparent organic film 200 and the shielding film 210 may be further provided. The buffer layer 215 may have a structure in which a plurality of inorganic films, such as an oxide film and a nitride film, are stacked, and may be provided to protect the transparent organic film 200 and the shielding film 210 created as thin films upon formation of a touch electrode array (e.g., sensor electrode, routing line, and pad electrode) on the transparent organic film 200 and the shielding film 210. The metal pattern 221 and the sensor electrodes 231 and 233, and the routing line 222 and the pad electrode 220 may directly contact the buffer layer 215.

The transparent organic film 200 and the shielding film 210 may be thin films having a much smaller thickness of, e.g., 1 to 10 μm, as compared to related art films having a thickness of several hundreds or tens of μm, which may be substantially provided (or formed) on a glass substrate or a sacrificial layer disposed on the glass substrate. In addition, unlike the case in which a film having an independent structure is adhered to another component via an additional adhesive layer, the transparent organic film 200 and the shielding film 210 may be provided (or formed) by depositing or coating a material, followed by curing, in the film formation process of the touch electrode array, and an additional adhesive layer for bonding to another component may not be needed in the touchscreen. The transparent organic film 200 may include a transparent organic film such as photo acryl, and may be provided (or formed) by applying a liquid material and then curing the same. The shielding film 210 may be an organic film including the same or a similar base to the transparent organic film 200, and may be supplemented with a black pigment or carbon black.

In addition, the sensor electrode is provided as one of a transmission electrode (Tx electrode) and a reception electrode (Rx electrode) which cross each other on the buffer layer 215. The transmission electrode (Tx electrode) and the transmission electrode (Rx) are electrically isolated. In the drawing, the reception electrode (Rx) is defined as a first sensor electrode 231 and is disposed in a vertical direction, and the transmission electrode (Tx) is defined as a second sensor electrode 233 and is disposed in a horizontal direction. However, the dispositions of the transmission electrode (Tx) and the reception electrode (Rx) may be interchanged.

Meanwhile, one of the first and second sensor electrodes 231 and 233 may include a plurality of uniform polygonal or circular patterns spaced from one another and a bridge electrode 251 connecting the patterns, and the other may include a plurality of uniform polygonal or circular patterns and a connection part thereof which are integrated together. The examples of FIGS. 2 and 3 show first sensor electrodes 231 spaced in one direction and connected through the bridge electrode and a connection part 233a of the second sensor electrode 233 between the first sensor electrodes 231. The first sensor electrodes 231 may include a plurality of uniform polygonal or circular patterns spaced apart from one another, and the second sensor electrodes 233 may be integrated with the connection part 233a. In addition, the first and second sensor electrodes 231 and 233 may be transparent metal oxide films, such as indium tin oxide (ITO), indium zinc oxide (IZO), or indium tin zinc oxide (ITZO) films.

Meanwhile, because the first and second sensor electrodes 231 may include transparent metal oxide films, to reduce surface resistance thereof, they may be connected to metal patterns 221 having a smaller and more regular mesh shape than the first and second sensor electrodes 231 and 233 in upper and lower parts. Although the example drawing shows that the metal pattern 221 may be provided under the first sensor electrode 231, when the first sensor electrode 231 may extend in an intersection direction, a metal pattern having the same or similar shape may be provided under and connected to the second sensor electrode 233.

The metal pattern 221 may include a metal having high conductivity, such as copper (Cu), aluminum (Al), chromium (Cr), and/or tungsten (W). In addition, one of the first and second sensor electrodes 231 and 233 may be connected to a plurality of metal patterns 221. In some cases, the first and second sensor electrodes 231 and 233 may be separately provided in the respective intersections of metal patterns. Such a separate component is also called a "segment electrode." In addition, the first sensor electrodes 231 spaced apart from one another may be electrically connected via the bridge electrode 251.

Meanwhile, a pad electrode 220 receiving or transmitting a signal through a touch control unit (not shown) and a routing line 222 connecting the pad electrode 220 to an edge of the sensor electrode 231 may be disposed in the dead area DA. The example of FIG. 2 shows that a touch pad part provided with a plurality of pad electrodes 220 of a touchscreen 2000 may be provided at both sides of the upper edge of the dead area DA. However, embodiments are not limited to this configuration. For example, the touch pad part may be provided only at one side thereof. The touch pad part may include an anisotropic conductive film 525 including a conductive ball (not shown) in the pad electrodes 220. Through the anisotropic conductive film 525, a sub-pad electrode disposed in a display panel and the pad electrode 220, which may be joined to each other, can be electrically connected to each other. The anisotropic conductive film 525 may be disposed in an opposite surface where the shielding film 210 is not provided (or formed).

The pad electrode 220 may be connected to a flexible printed circuit board (FPCB) provided with a touch control unit so that it can be connected to the touch control unit, or, as described above, the pad electrode 220 may be connected to connected to the sub-pad electrode of the opposite display panel 100 through the conductive ball so that it can be connected to the touch control unit provided in a printed circuit board (not shown). The pad electrode 220 may have a structure in which a metal pad pattern 223, a transparent metal oxide film pattern 232, and a bridge metal pattern 252 are stacked, like upper and lower components of the first sensor electrode 231.

Meanwhile, the bridge electrode 251 may be electrically isolated from the connection part 233 of the sensor electrode disposed in the intersection direction. Accordingly, the first sensor electrode 231 and the metal pattern 221 connected to each other and the second sensor electrode 233 electrically isolated therefrom may be covered with an insulation film 241. A predetermined part of the insulation film 241 may be removed to form contact holes 241a and 241b, which may expose the upper part of the first sensor electrode 231. A bridge electrode 251 connected to the upper part of the first sensor electrodes 231 adjacent through the contact holes 241a and 241b may be provided (or formed) on the insulation film 241. In addition, in the same process of providing (or forming) the bridge electrode 251, a bridge metal pattern 252 constituting an upper metal of the pad electrode 220 may be provided (or formed) in the dead area DA.

The protective film 260 covering the bridge electrode 251 and the insulation film 241 may be provided (or formed) in the active area AA. The protective film 260 may planarize a surface facing the display panel 100. That is, the touchscreen shown in FIG. 3 may be turned over, a surface of the touchscreen where the transparent organic film 200 and the shielding film 210 may be disposed may face the polarizing plate 300, and may be adhered through the second adhesive layer 530; and the upper surface of the protective film 260 may face the display panel 100, and may be adhered through the first adhesive layer 520.

In addition, as shown in the example drawing, the protective film 260 may cover the entire surface of the active area AA, and may extend farther to cover the routing line 222. The pad electrode 220 may be a region connected to the sub-pad electrode provided (or formed) in the facing display panel 100, or may be connected to a flexible printed circuit board. This region may not be provided with the protective film 260.

In addition, the region "A" of FIG. 2 has a structure in which, around one diamond-shaped reception electrode (Rx), a plurality of transmission electrodes (Tx) having the same shape may be provided. The region "A" may be repeated throughout the active area. In some cases, the shapes of the reception electrode (Rx) and the transmission electrode (Tx) can be changed to other shapes, such as polygons or circles, and the reception electrode (Rx) and the transmission electrode (Tx) may include sensor electrodes connected to the metal pattern 221 having a mesh like that described above.

Hereinafter, the following drawings show a Comparative Example compared with the touchscreen integrated display device according to an embodiment of the present disclosure and bending defects thereof.

Figure 4A:
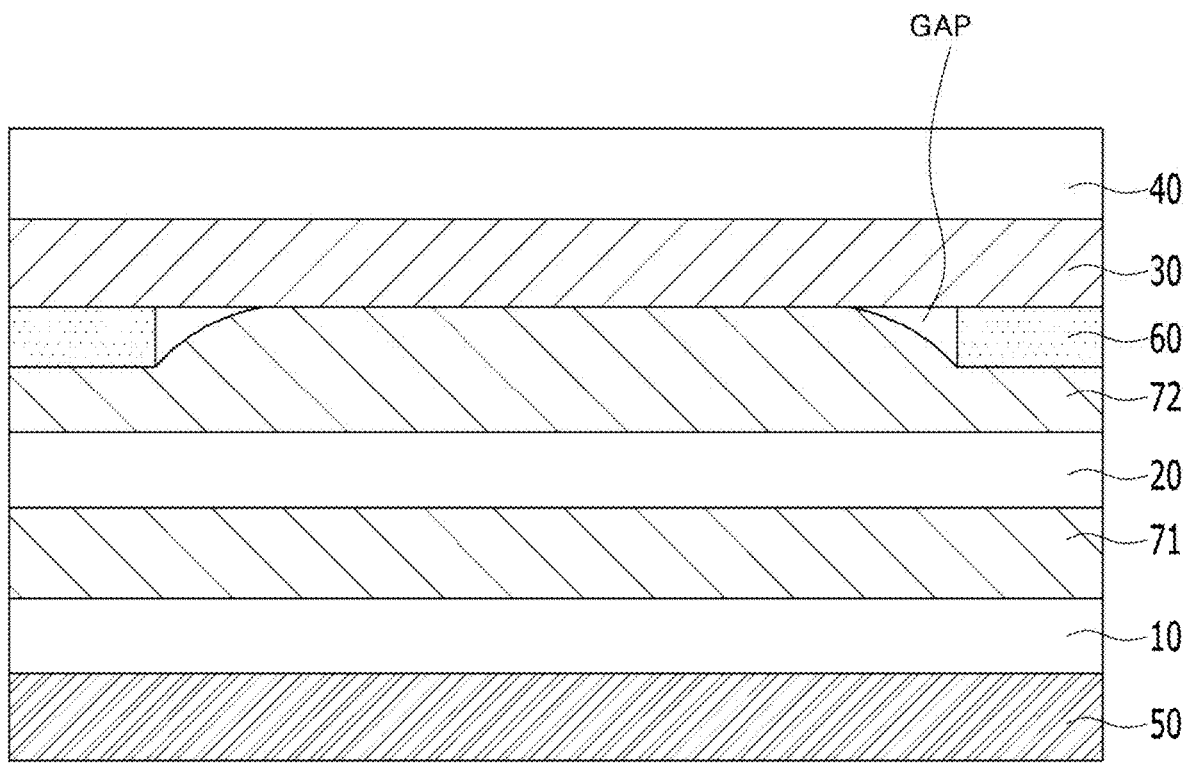
FIG. 4A is a sectional view illustrating the touchscreen integrated display device according to a Comparative Example.
Figure 4B:
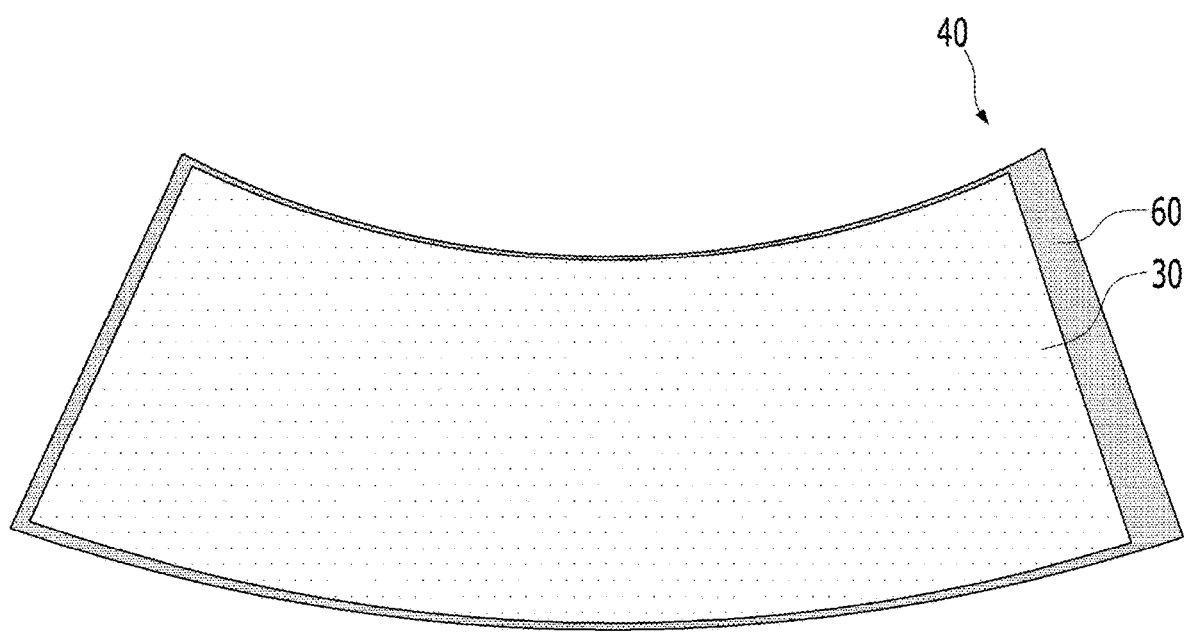
FIG. 4B is a view showing a bending phenomenon in the Comparative Example.

FIG. 4A is a sectional view illustrating the touchscreen integrated display device according to a Comparative Example. FIG. 4B is a view showing a bending phenomenon in the Comparative Example.

As shown in FIG. 4A, the touchscreen integrated display device according to the Comparative Example includes a shielding film 60 disposed at the side of a polarizing plate 30. In addition, a back plate 50 is disposed under the display panel 10, a touchscreen 20 is adhered to the display panel 10 through a first adhesive layer 71, the touchscreen 20 is adhered to the polarizing plate 30 having a shielding film 60 through a second adhesive layer 72 interposed therebetween, and a cover window 40 is adhered to the surface of the polarizing plate 30 not having the shielding film 60.

Here, because the polarizing plate 30 includes a linear polarizing layer and a retardation optical layer and therefore is elongated in a predetermined direction, it is difficult to provide a shielding film in the polarizing plate 30. Accordingly, the polarizing plate 30 is provided in the form of a film having a stack structure of at least three layers of a functional layer having polarization and optical functions and protective layers disposed in upper and lower parts thereof, and the shielding film 60 is patterned and provided on one surface of the protective layer. That is, the shielding film 60 should be provided at the periphery of the surface of the finished polarizing plate 30 and the shielding film 60 protrudes from the surface of the polarizing plate 30. Accordingly, when the polarizing plate 30 is adhered to the touchscreen 20 through the second adhesive layer 7, there is a large step between the region where the shielding film 60 is provided (or formed) and the region where the shielding film 60 is not provided (or formed), rather than the flat area. This step area is not filled with the second adhesive layer 72, and causes creation of a gap GAP that serves as an air gap and therefore lead to visibility defects or deterioration in adhesive strength. In addition, to prevent this problem, the second adhesive layer 72 should be provided (or formed) to be thick enough for the shielding film 60 to sufficiently planarize the step present on the surface of the polarizing plate 30. For this reason, it may be difficult to realize thinness of the touchscreen integrated display device.

In addition, the touchscreen integrated display device according to the Comparative Example is formed by applying a material for the shielding film 60 onto the finished polarizing plate 30, followed by patterning or printing. The patterned or printed material is cured by thermal curing. In this process, as shown in FIG. 4B, there is a problem in which the polarizing plate 30 is bent and thus cannot be returned to the original state. This bendability defect occurs even though the shielding film 60 is patterned or printed under the condition that the polarizing plate 30 is adhered to the cover window 40. When respective finished layers having slim thicknesses to impart flexibility to a device receive heat, they cannot return to an original state after deformation by heat. In addition, although the layers are bent in a direction opposite to the bending by applying physical strength thereto and then planarized, and a second adhesive layer 72 is inserted and adhered to the touchscreen 20, the polarizing plate 30 is rolled upward in the bending defect state again, and there is a tendency of deteriorated adhesion to the second adhesive layer 72 at the edge.

The touchscreen integrated display device of embodiments of the present disclosure can solve this problem of the Comparative Example by imparting a shielding film to the touchscreen. In particular, the shielding film according to embodiments is neither an independent film nor a pattern that protrudes from the glass substrate, and has the same surface as the transparent organic film provided with the sensor electrode. As a result, because there is no gap between the polarizing plate and the touchscreen, the two layers can be adhered only with a thin adhesive layer in an embodiment. Accordingly, reliability is improved by embodiments of the present disclosure.

In addition, in embodiments of the present disclosure, peripheral routing lines and pad electrodes are disposed on a buffer layer with a thickness of 1 μm or less on the shielding film, or directly contact the shielding film so that the shielding film covers the routing lines/pad electrodes with almost no vertical distance therebetween. As a result, as compared to the configuration wherein the shielding film is disposed on the touchscreen and other components, light leakage and visibility defects by routing lines or the like can be reduced or prevented, regardless of the viewing angle.

In addition, when seen from the side surface, the transparent organic film contacts the inside of the outer shielding film. As a result, when cracks occur in the periphery, the cracks are transferred only to the shielding film and transfer to transparent organic film is primarily blocked in embodiments of the present disclosure.

In addition, the touchscreen integrated display device according to an embodiment of the present disclosure may be provided with a shielding film by film formation during the method of manufacturing the touchscreen and with a transparent organic film provided (or formed) therein. As a result, unlike a pattern provided on an individual film, in the initial step or operation of providing (or forming) an array, the shielding film may be provided (or formed), and the shielding film can thus be provided without any influence on internal configuration of the touchscreen. In addition, after providing (or forming) a shielding film and a transparent organic film, an insulation film for planarizing the sensor electrode and pad electrode/routing line may be provided thereon. Thus, heat may not be applied from the outside to the touchscreen. For at least this reason, bendability defects may not be present in specific parts of embodiments.

For example, a method of manufacturing the touchscreen integrated display device according to an embodiment of the present disclosure will be described in detail with reference to the annexed drawings. First, a method for manufacturing a touchscreen will be described.

FIGS. 5A to 5D are plan views illustrating processes of a method for manufacturing the touchscreen integrated display device according to an embodiment of the present disclosure. FIGS. 6A to 6D are sectional views illustrating the manufacturing method corresponding to FIGS. 5A to 5D. FIGS. 7A to 7E are sectional views illustrating a method for manufacturing a touchscreen according to an embodiment of the present disclosure.

In an actual process, a plurality of unit touchscreens may be provided (or formed) on a glass substrate 201, may be bonded to a plurality of display panels produced on another glass substrate in parallel, and may then be scribed and cut to the size corresponding to respective display devices. That is, the process shown in the examples of FIGS. 7A to 7E may also be conducted on the glass substrate. After the process of the FIG. 7A example, parts of the active area and the dead area of each touchscreen are shown for illustrating the shape in more detail. In addition, the examples of FIGS. 7A to 7E illustrate a method for manufacturing an independent touchscreen.

Figure 5A:
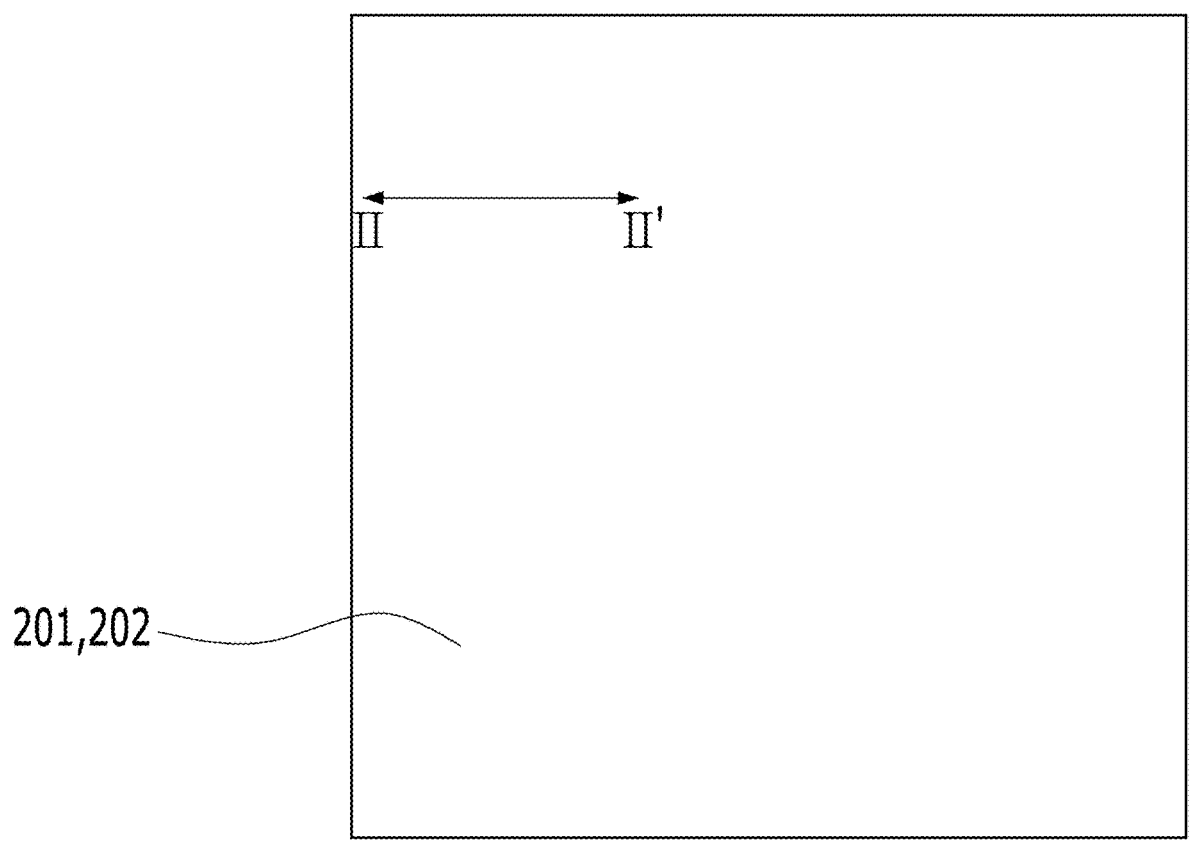
FIGS. 5A to 5D are plan views illustrating processes of a method for manufacturing the touchscreen integrated display device according to an embodiment of the present disclosure.
Figure 6A:
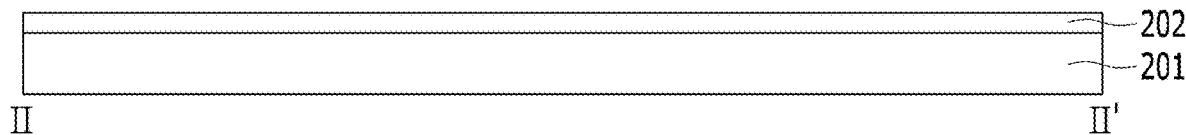
FIGS. 6A to 6D are sectional views illustrating the manufacturing method corresponding to FIGS. 5A to 5D.

First, as shown in the examples of FIGS. 5A and 6A, a sacrificial layer 202 may be deposited on the glass substrate 201. The sacrificial layer 202 may be provided to protect components disposed thereon during removal of the glass substrate 201 after the subsequent process for manufacturing the touchscreen. In some cases, the sacrificial layer 202 may be omitted.

Figure 5B:
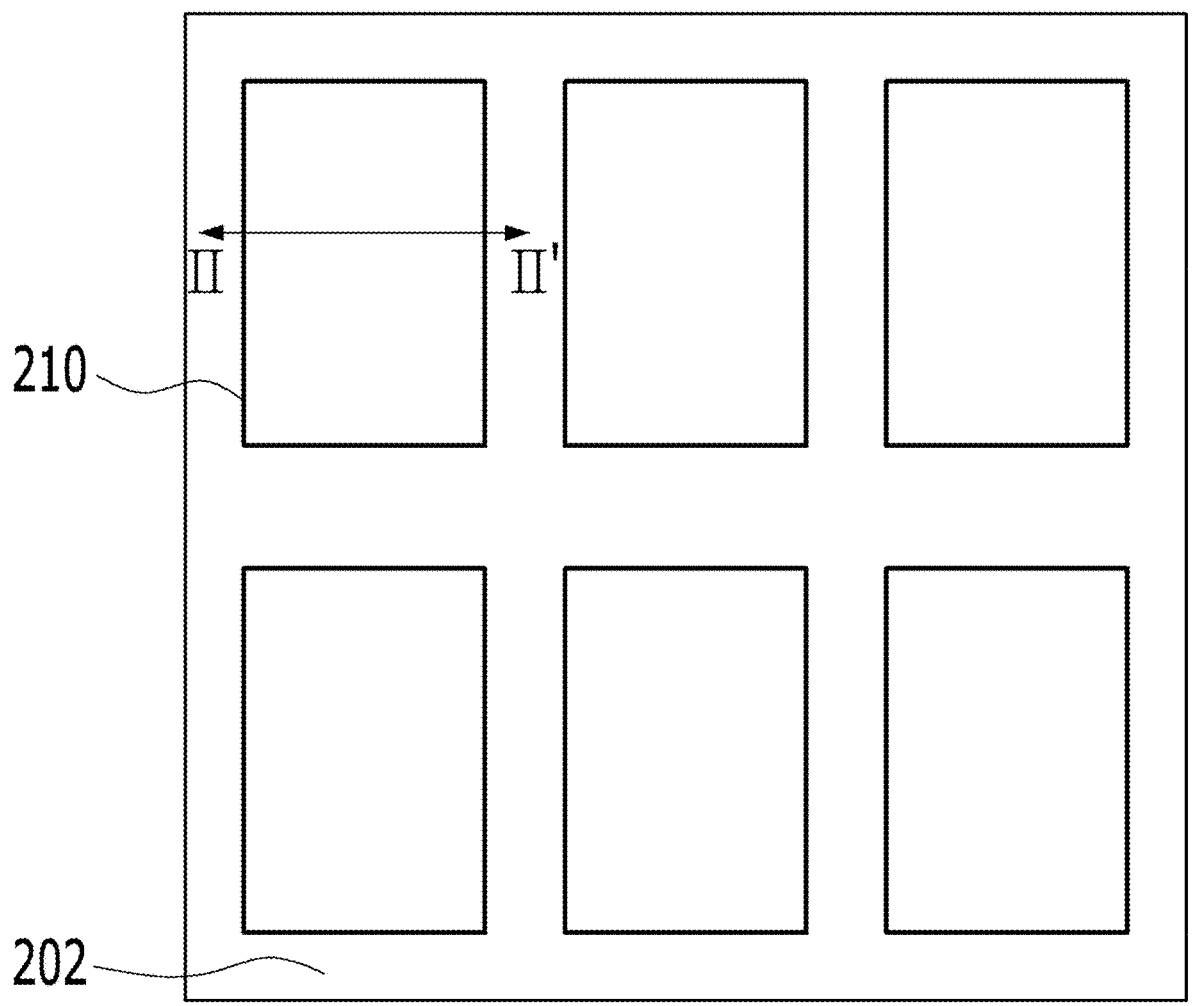
Figure 6B:
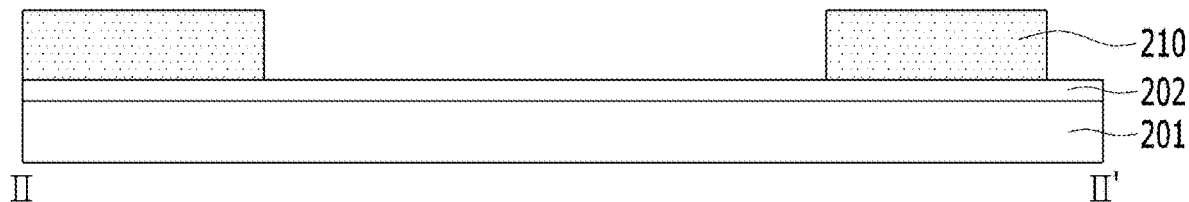

Subsequently, as shown in the examples of FIGS. 5B and 6B, a shielding film 210 having a closed loop shape may be provided on the sacrificial layer. The shape of the shielding film 210 illustrated in the example shows a rectangular closed loop, but embodiments are not limited thereto. The shielding film 210 may be provided (or formed) along the periphery, depending on the shape of the touchscreen realized, and the shape of shielding film 210 may be determined from various shapes of closed loops, depending on the plane shape of the touchscreen. In addition, the example drawings show a plurality of touchscreens provided on a mother glass substrate 20, each touchscreen region having a closed loop-shaped shielding film 210.

Figure 5C:
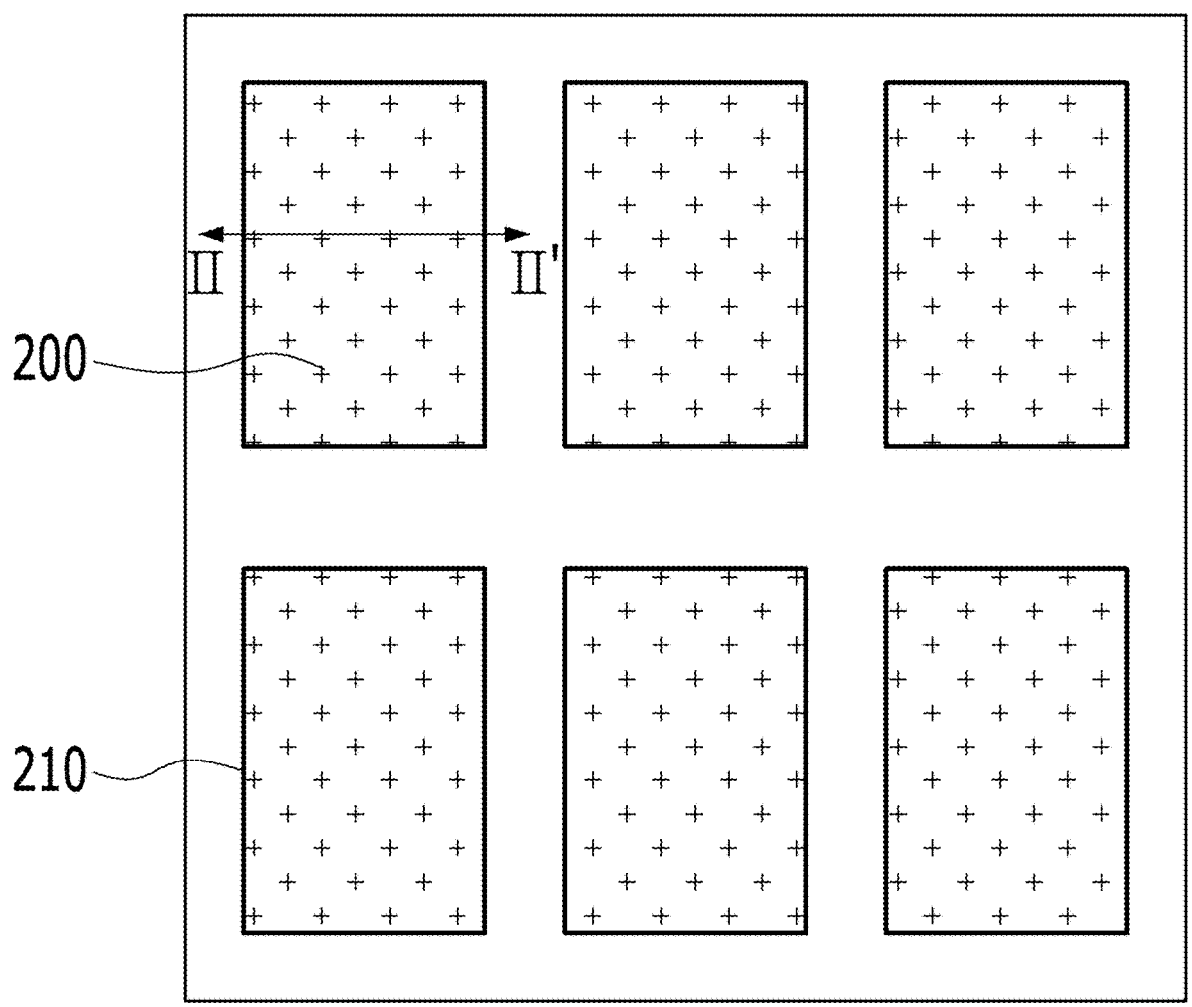
Figure 5D:
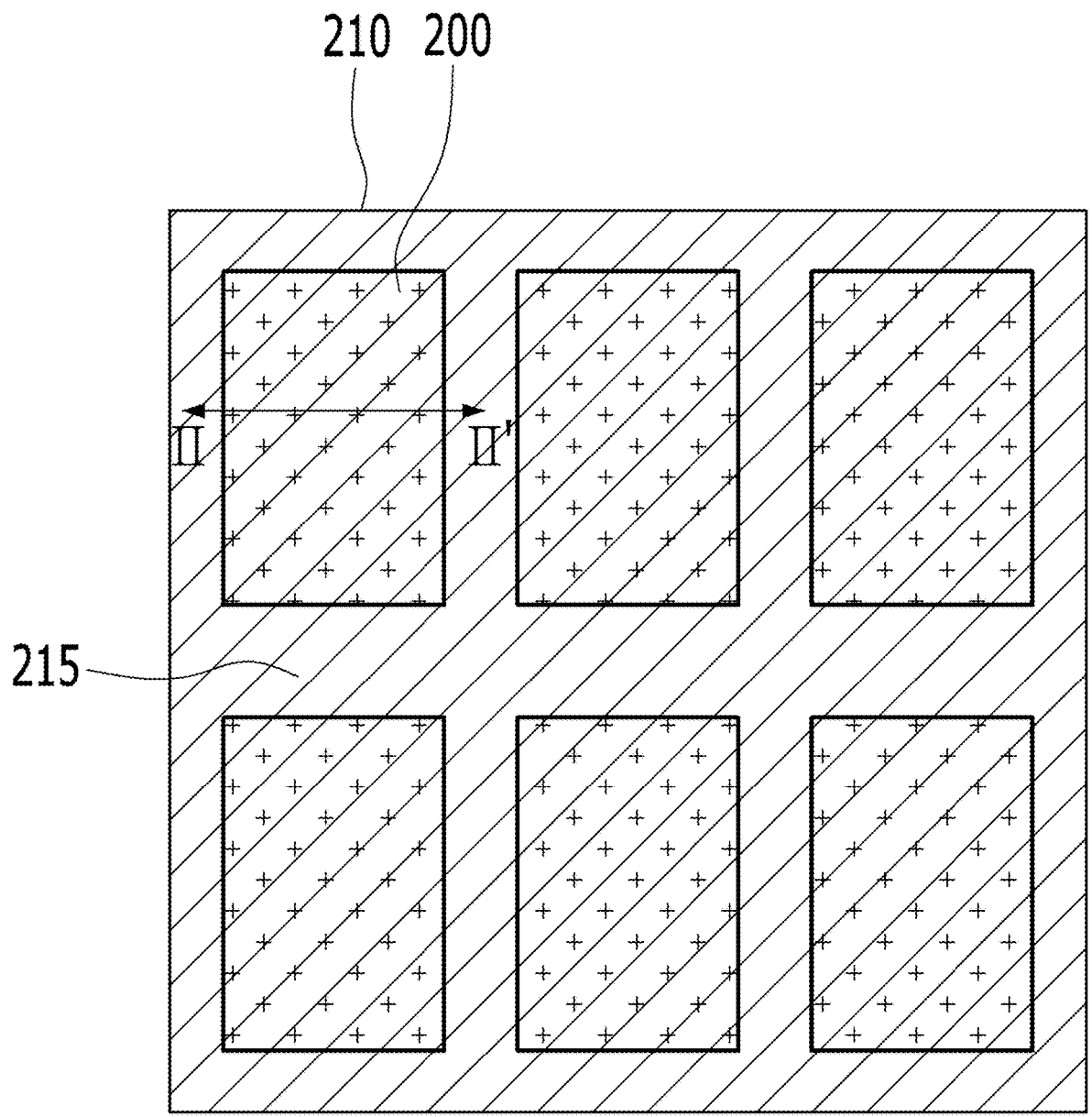
Figure 6C:
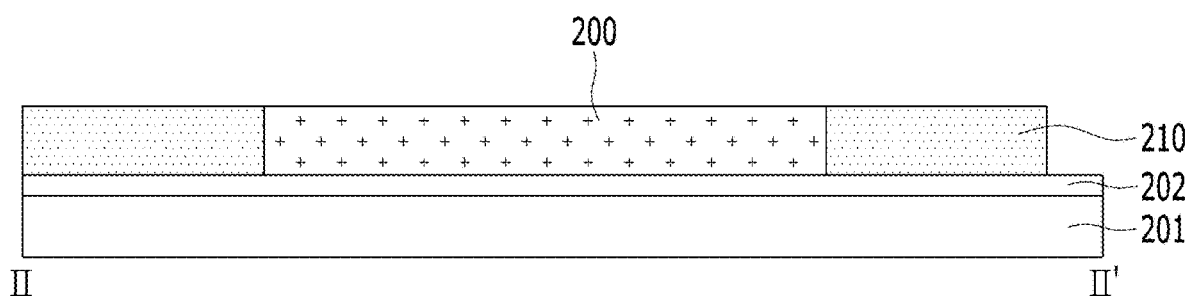
Figure 6D:
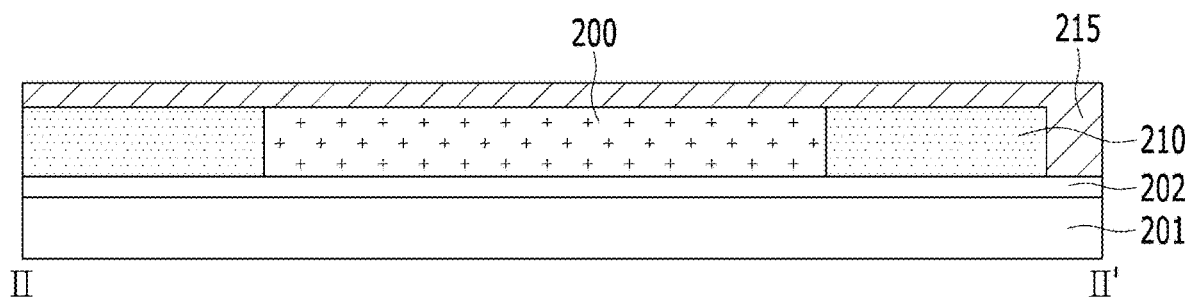

Subsequently, as shown in the examples of FIGS. 5C and 6C, a transparent organic film 200 may be filled in the shielding film 210 on the sacrificial layer 202. Subsequently, as shown in the examples of FIGS. 5D and 6D, a buffer layer 215 covering the upper surface of the sacrificial layer 202, including the shielding film 210 and the transparent organic film 200 and including a plurality of layers of inorganic films, may be provided (or formed). The buffer layer 215 may cover the upper surface of the transparent organic film 200 and the shielding film 210, as well as the side of the shielding film 210, and may be provided (or formed) over the entire surface of the sacrificial layer 202.

Figure 7A:
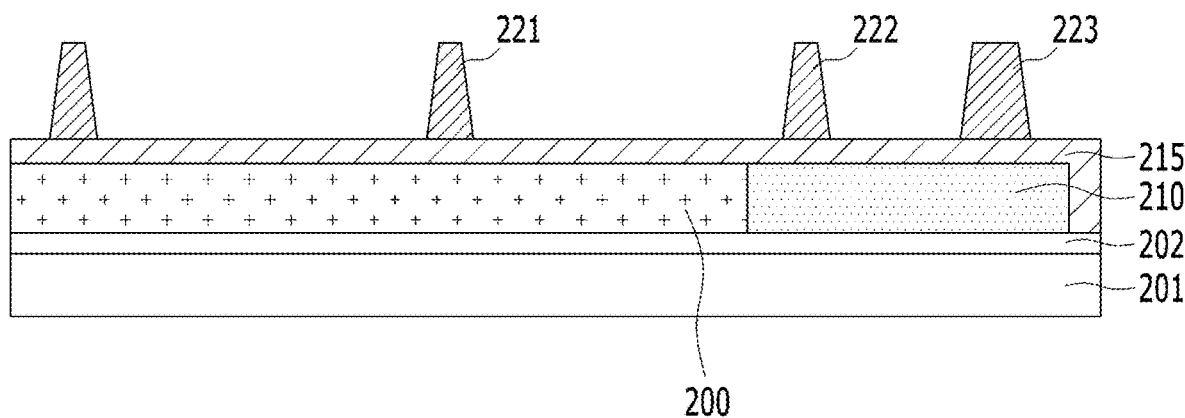
FIGS. 7A to 7E are sectional views illustrating a method for manufacturing a touchscreen according to an embodiment of the present disclosure.

Subsequently, as shown in the FIG. 7A example, in each touchscreen region, a metal pattern 221 may be provided (or formed) on the transparent organic film 200, and a routing line 222 and a metal pad pattern 223 may be provided (or formed) on the shielding film 210. The metal pattern 221 may be finely provided (or formed) as a mesh within the boundary of polygons or circles virtually spaced. In addition, these virtual polygons or circles may serve as reception regions or transmission regions, and the reception regions may cross the transmission regions in the form of a plurality of rows or a plurality of columns. In addition, metal patterns 221, including the reception regions and transmission regions, may be electrically isolated from each other.

Figure 7B:
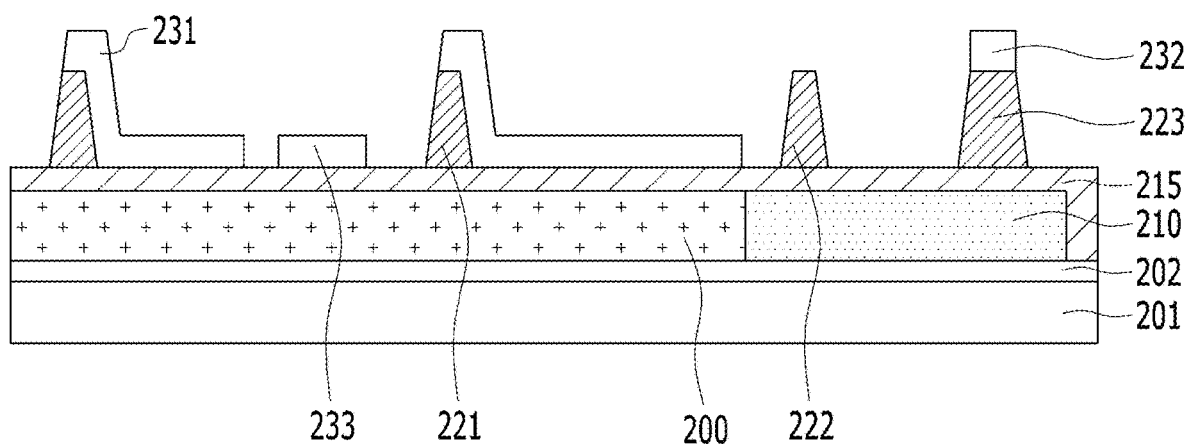

Subsequently, as shown in the FIG. 7B example, the first sensor electrode 231 connected to the metal pattern 221 may be provided (or formed). Although not shown, the first sensor electrode 231 and the second sensor electrode 233 may be simultaneously provided (or formed), e.g., in the same process, such that the first sensor electrode 231 may cross the second sensor electrode 233. The first and second sensor electrodes 231 and 233 may be provided (or formed) using the same transparent metal oxide film. The first sensor electrode 231 may be provided (or formed) as polygonal or circular patterns spaced by a predetermined distance in any one of the reception region and the transmission region. The second sensor electrode 233 may have the same or similar shape to the first sensor electrode 231, and may include polygonal or circular patterns and a connection part 233a integrated with the patterns. In the example drawing, the connection part 233a of the first sensor electrode 231 and the second sensor electrode spaced from each other is shown, and the connection part of the second sensor electrode 233 is composed of a single transparent metal oxide film and/or a metal pattern disposed thereunder. The first and second sensor electrodes 231 and 233 may be provided (or formed) and, at the same time or in the same process, a transparent metal oxide film pattern 232 may be provided (or formed) on the metal pad pattern 223.

Figure 7C:
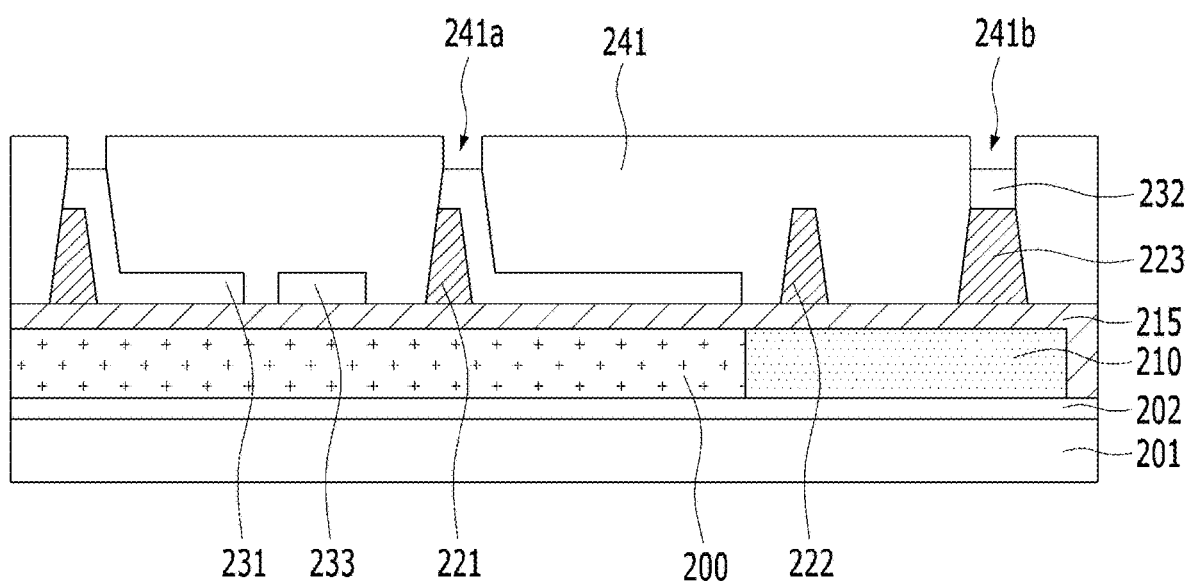

Subsequently, as shown in the FIG. 7C example, an insulation film 241 may be provided (or formed) such that it may cover the first and second sensor electrodes 231 and 233, the routing lines 222, and the transparent metal oxide film pattern 232. Subsequently, the insulation film 241 may be selectively removed to form first and second contact holes 241a and 241b exposing the first sensor electrode 231 and the transparent metal oxide film pattern 232.

Figure 7D:
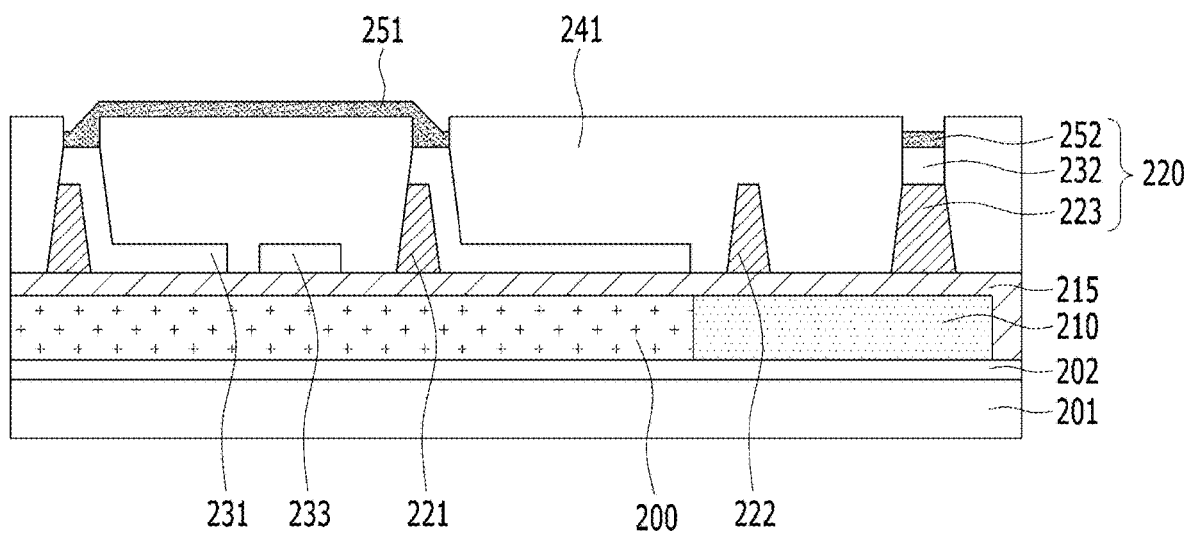
Figure 7E:
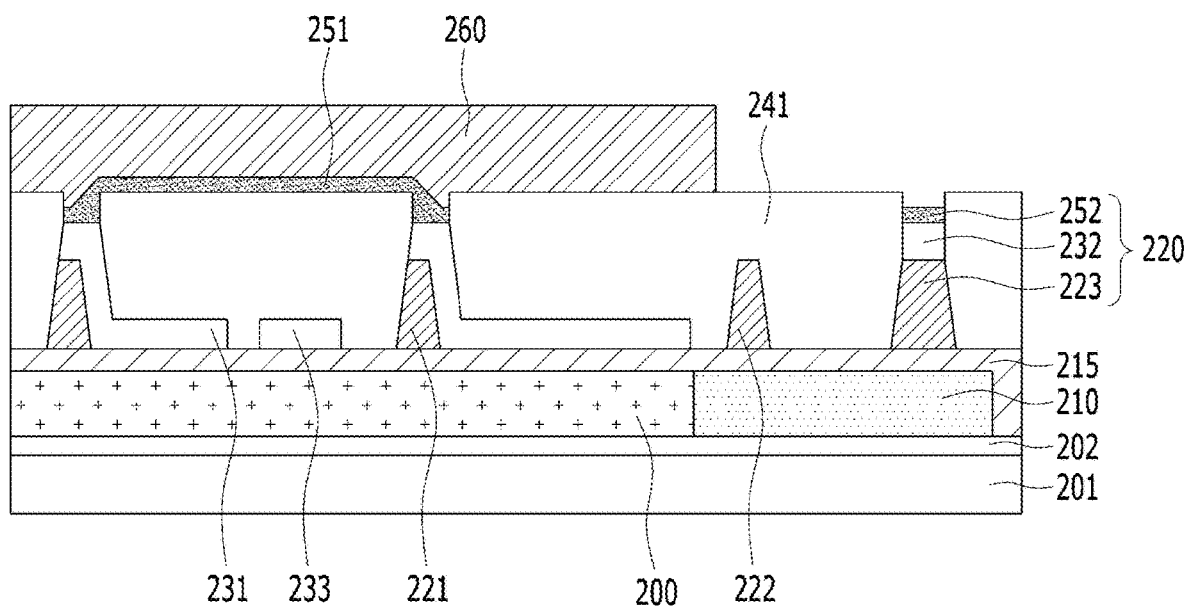

Subsequently, as shown in the FIG. 7D example, a bridge electrode 251 electrically connecting the first sensor electrodes 231 exposed through the first contact holes 241a and 241b may be provided (or formed). In the same process, a bridge electrode pattern 252 connected through the second contact hole 241 to the transparent metal oxide film pattern 232 may be provided (or formed). Through this process, a pad electrode 220, which may have a stack structure of a metal pad pattern 223, a transparent metal oxide film pattern 232 and a bridge electrode pattern 252 may be provided (or formed) in the dead area DA. The pad electrode 220 may transfer a signal to the sensor electrodes 231 and 233, or may receive the signal from the sensor electrodes 231 and 233. Subsequently, the protective film 260 covering the bridge electrode 251 may be provided (or formed) to cover at least the active area AA.

Hereinafter, a structure and manufacturing method of the touchscreen integrated display device according to an embodiment of the present disclosure will be described in detail.

Figure 8:
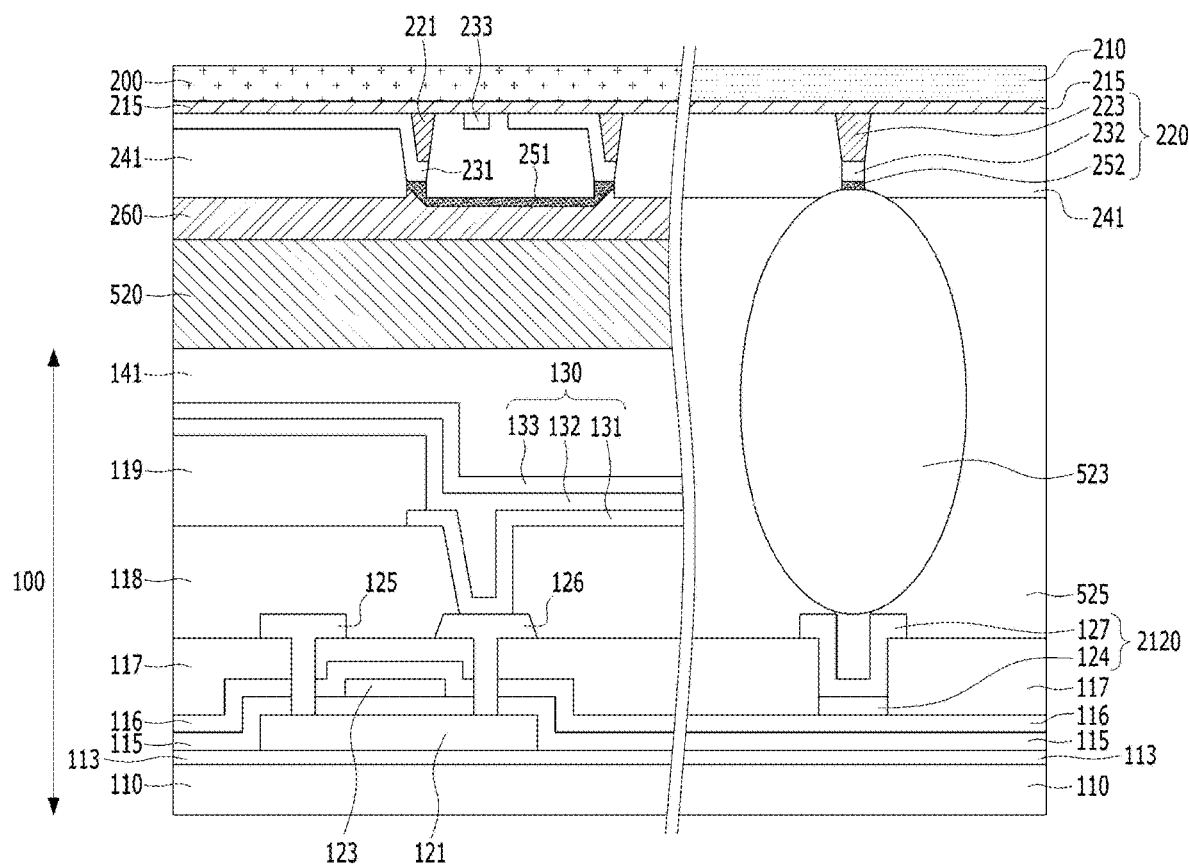
FIG. 8 is a sectional view illustrating the touchscreen integrated display device according to an embodiment of the present disclosure in detail.

FIG. 8 is a sectional view illustrating the touchscreen integrated display device according to an embodiment of the present disclosure in detail.

As shown in the FIG. 8 example, the touchscreen 2000 provided (or formed) by the described above may be turned over, and thus may be joined to the display panel 100. The display panel 100 may include a plurality of sub-pixels in the active area. Each sub-pixel may include at least one thin film transistor and an organic light-emitting diode 130. In addition, the display panel 100 may be provided (or formed) by providing (or forming) a plurality of inorganic buffer layers 113 on a substrate 110, and then providing (or forming) a thin film transistor and an organic light-emitting diode 130 in an active area AA and providing (or forming) a pad electrode for an array (not shown) and a sub-pad electrode 2120 of the pad electrode 220 of the touchscreen in a dead area.

The thin film transistor may be provided (or formed) by providing (or forming) an active layer 121 in a predetermined part of an inorganic layer 113, providing (or forming) a gate insulation film 115 covering the active layer 121, providing (or forming) a gate electrode 123 in an area in which the active layer 121 overlaps the gate insulation film 115, then providing (or forming) a first interlayer insulation film 116 covering the gate electrode 123, providing (or forming) a second interlayer insulation film 117, and selectively removing the second interlayer protective film 117, the first interlayer insulation film 116 and the gate insulation film 115 to expose both ends of the active layer 121 to form a drain electrode 125 and a source electrode 126 respectively connected to both ends of the exposed active layer 121.

In addition, after providing (or forming) the protective film 118 covering the drain electrode 125 and the source electrode 126, a contact hole exposing a part of the source electrode 126 may be provided (or formed), and a first electrode 131 connected to the source electrode 126 exposed through the contact hole may be provided (or formed) on the protective film 118.

Meanwhile, in the dead area DA, a first sub-pad pattern 124 may be provided (or formed) in the same process as providing (or forming) the gate electrode 123, and a second sub-pad pattern 127 disposed on the first sub-pad pattern 124 may be provided (or formed) in the same process as providing (or forming) the drain/source electrodes 125 and 126. A stack thereof may constitute a sub-pad electrode 2120. The example shown in FIG. 8 shows a region in which there is a sub-pad electrode that is a part of the dead area connected to the pad electrode of the touchscreen. In the same process, the array pad electrode may be provided (or formed) in the same shape or one layer of the metal electrode, or a multilayer laminate may be provided in the dead area.

Subsequently, a bank 119 defining a light-emitting part while partially overlapping the edge of the first electrode 131 may be provided (or formed). Subsequently, an organic light-emitting layer 132 and a cathode 133 may be sequentially provided (or formed) on the bank 119 and the first electrode 131. Here, a structure in which the first electrode 131, the organic light-emitting layer 132, and the cathode 133 are stacked is referred to as an "organic light-emitting diode" 130.

In addition, a sealing part 141 covering the upper and side parts of the organic light-emitting diode 130 may be provided in the uppermost part of the display panel 100. The sealing part 141 may sufficiently cover the active area AA, and may extend to a part of the dead area DA, but may be removed in a part in which the sub-pad electrode 2120 is disposed. The sealing part 141 may be a stack in which an inorganic film alternates with an organic film, and at least the inorganic film includes a plurality of layers.

The display panel 100 is described as an organic light-emitting display panel according to an embodiment. However, in some embodiments, another type of panel may be used as an alternative, so long as it is flexible.

Meanwhile, the touchscreen 2000 described above may be turned over, and the protective film 260 may be joined to the display panel 100 such that the protective film 260 may face the display panel 100 via a first adhesive layer 520 provided between the touch panel 100 and the touchscreen 2000. In the same process, an anisotropic conductive film 525 having a conductive ball 523 may be applied between the pad electrode 220 and the sub-pad electrode 2120 such that the anisotropic conductive film 525 may cover the touch pad part, which may then be used for bonding of upper and lower parts. Because the anisotropic conductive film 525 and the first adhesive layer 520 have different heights and substantially do not include the organic light-emitting diode 130 and the sealing part 141, the sub-pad electrode 2120 may be lower than the uppermost surface of the sealing part 141 of the active area, and the anisotropic conductive film 525 including the conductive ball 523 may have a greater height than the first adhesive layer 520 to compensate for this thickness gap.

Meanwhile, the display panel 100 may include a substrate 110, which may be a thin organic film or a thin plastic film. Similar to the touchscreen, a mother glass substrate and/or a sacrificial layer (not shown) may be prepared, the substrate 110 may be applied thereto, and a subsequent array formation process may be conducted independently in a plurality of unit regions.

In addition, the mother glass substrate, on which the array formation process may be completed, may be bonded to a glass substrate including a plurality of touchscreen regions, the upper glass substrate may be scribed and cut in each touchscreen region on the boundary of the shielding film (e.g., black matrix), and the glass substrate and the sacrificial layer may be removed. Similarly, the lower mother glass substrate may be scribed and cut in each unit region, and the mother glass substrate and the sacrificial layer may then be removed. Removal of the glass substrate/mother glass substrate may be carried out, for example, by laser irradiation.

In addition, a second adhesive layer 530 may be disposed on the rear surface of the shielding film 210 and the transparent organic film 200 of the touchscreen, from which the glass substrate/sacrificial layer may be removed, and may then be adhered to the polarizing plate 300. In this case, one surface of the polarizing plate 300 may already be adhered to the cover window 400.

Hereinafter, the shape of the touchscreen according to another embodiment will be described.

Figure 9A:
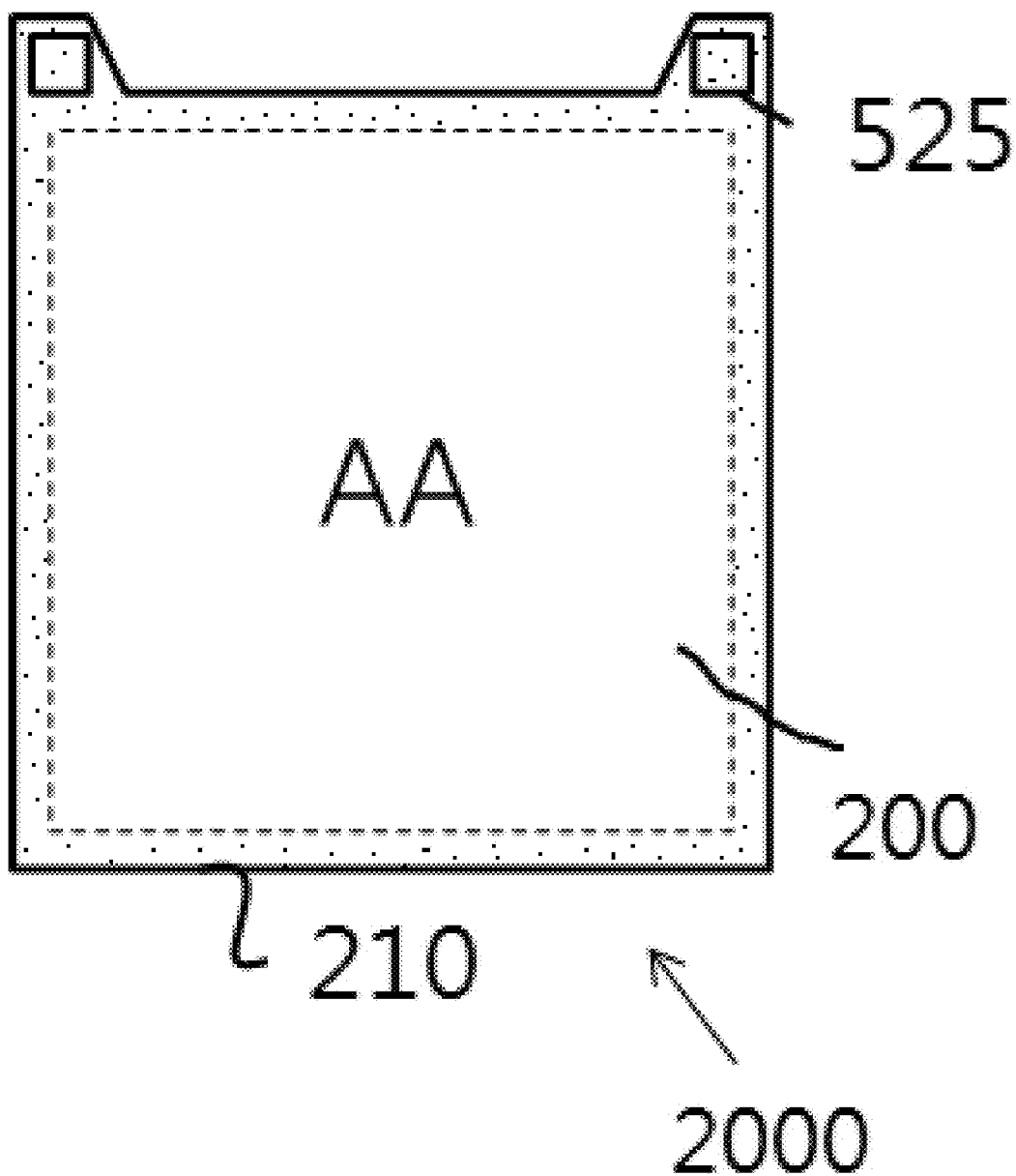
FIG. 9A and FIG. 9B are plan views illustrating a touchscreen according to another embodiment of the present disclosure.
Figure 9B:
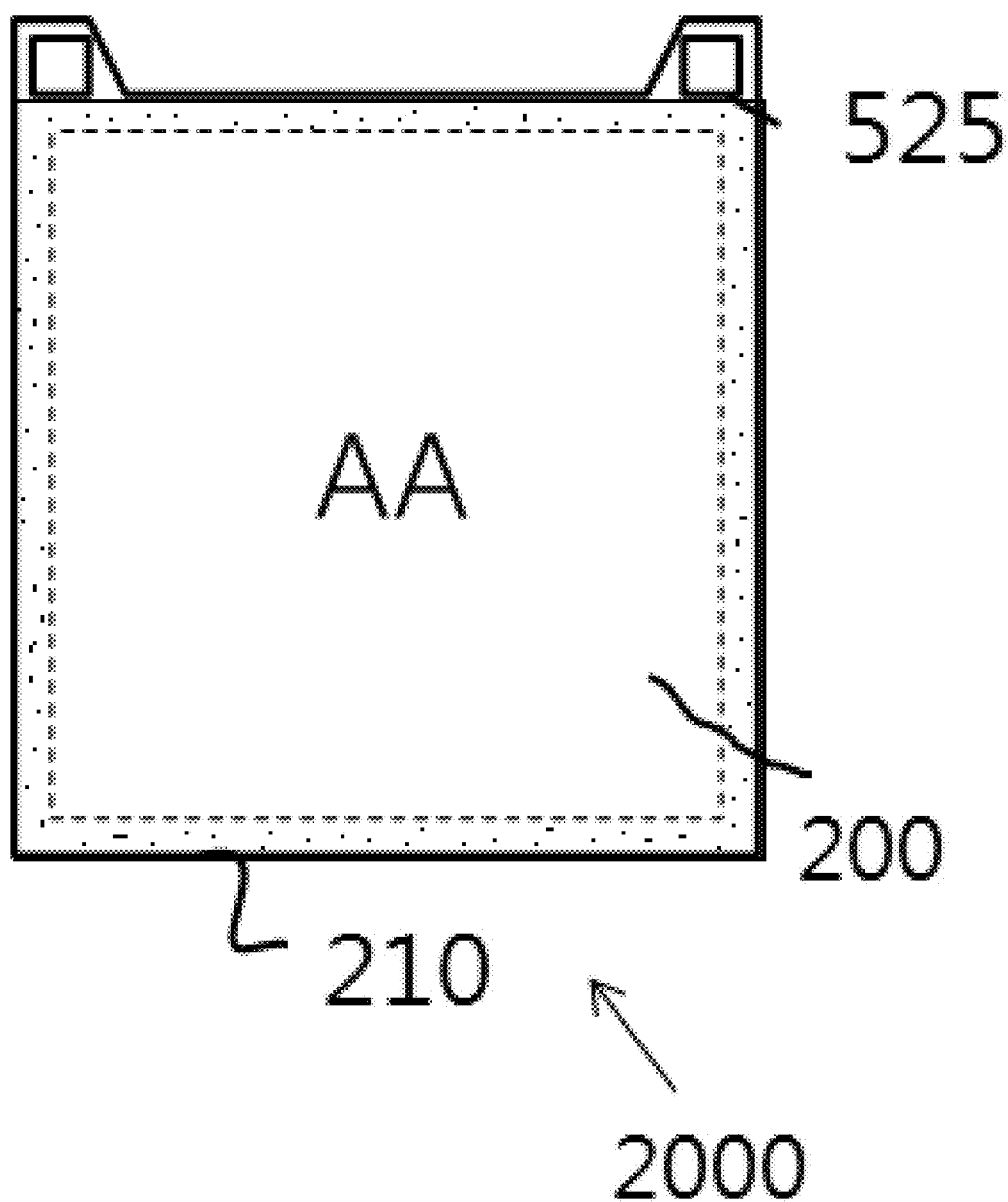

FIG. 9A and FIG. 9B are plan views illustrating a touchscreen according to another embodiment of the present disclosure.

The examples of FIGS. 9A and 9B show a touchscreen having a structure in which only both sides of the upper edge of a dead area, in which a touch pad part may be disposed, protrude, instead of the rectangular plane shape, and the region therebetween is an empty area in which the pad part for array of the display panel is to be disposed. The region labeled "525" shown is an area in which an anisotropic conductive film may be coated corresponding to the touch pad part. The anisotropic conductive film 525 may be spaced from the first adhesive layer 520. The first adhesive layer (see reference numeral "520" of the FIG. 8 example) may cover the active area, and may extend to a part of the dead area DA, but may be spaced from the anisotropic conductive film 525.

In addition, the FIG. 9A example shows that the shielding film 210 may be provided throughout the dead area DA, except the active area AA. For example, the shielding film 210 may have a relatively large width in a region in which the touch pad part may be disposed, but may have a smaller width outside of the region.

The FIG. 9B example shows that the shielding film 210 may be provided outside of the touch pad part in which the anisotropic conductive film 525 may be applied. For example, the shielding film 210 may have four sides with the same width. In addition, in one example, the shielding film 210 may cover only the routing line (see reference "223" of the examples of FIGS. 2 and 3). Substantially, the protrusion, such as the touch pad part, may be a non-display region, although the viewer may change a viewing angle, because it may be shielded by other components in the touchscreen integrated display device. The component shown in the FIG. 9B example, although the shielding film 210 may cover only the routing line, may have the same function as the configuration where the aforementioned shielding film 210 may be provided (or formed) to be integrated with the touchscreen 2000.

In addition, as described above, the transparent organic film 200 may be disposed in the shielding film 210. Accordingly, the same surface effects may lead to the same effects of reducing or preventing bending defects, crack propagation and viewing, and of improving slimness. In addition, the feature that the surface of the shielding film 210 not having a routing line adhered to the display panel by the first adhesive layer is the same as described above and explanation of the same structure is omitted.

The touchscreen integrated display device of the present invention and the method of manufacturing the same may have at least the following effects.

First, upon manufacture of a touchscreen, a shielding film may be provided (or formed) in the form of a closed loop, a transparent organic film may be provided therein, and the shielding film and the transparent organic film may have the same plane. In addition, because routing lines and pad electrodes may be provided on the shielding film, when seen from the outside, the peripheral lines may be shielded by the shielding film, and may not be visible.

Second, the shielding film functioning to reduce or prevent visibility may be disposed in the touchscreen. Thus, a phenomenon in which protrusions formed on the polarizing plate and the cover window induce creation of a gap may be prevented.

Third, the shielding film may be provided in the same plane as the transparent organic film of the touchscreen so that the polarizing plate or display panel, and the touchscreen, which may be bonded together, can face each other on the even plane without any step. In addition, the shielding film may be disposed closest to the routing line in terms of a vertical cross-section. The defect of light leakage caused by routing lines from the side can be solved. When the shielding film is provided in the polarizing plate or cover window, the shielding film may protrude and may be disposed in a different plane than the touchscreen, and there may thus be a risk that a predetermined part may be visible, depending on viewing angle from the side. However, embodiments can solve this problem.

Fourth, in the first formation process of the touchscreen, when the shielding film is previously provided independently from the touchscreen, problems such as bending defects upon curing after separate film formation can be solved.

Fifth, in a touchscreen structure, the shielding film may be disposed at the periphery on a plane basis and the transparent organic film may be disposed therein. As a result, although application of stress, such as folding, may cause cracks in the peripheral shielding film, the transparent organic film including a different material may be disposed therein, which can block propagation of cracks.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A touchscreen integrated display device, comprising:
   a display panel comprising:
      an active area in a center of the display panel;
      a dead area at a periphery of the active area;
      at least one thin film transistor and an organic light-emitting diode connected to the thin film transistor in each of a plurality of sub-pixels defined in the active area; and
      a sub-pad electrode in the dead area;
   a touchscreen comprising:
      a transparent organic film corresponding to the active area;
      a shielding film surrounding a periphery of the transparent organic film;
      a sensor electrode disposed on the transparent organic film corresponding to the active area; and
      a routing line and a pad electrode on the shielding film corresponding to the dead area;
   a first adhesive layer between the display panel and the touchscreen, the first adhesive layer corresponding to the active area; and
   a polarizing plate on the touchscreen.

2. The touchscreen integrated display device of claim 1, wherein:
   the transparent organic film and the shielding film contact each other at sides thereof; and
   the transparent organic film and the shielding film have a step-free surface.

3. The touchscreen integrated display device of claim 2, further comprising a buffer layer covering the surface of the transparent organic film and the shielding film.

4. The touchscreen integrated display device of claim 2, wherein the sensor electrode, the routing line, and the pad electrode contact a surface of the buffer layer.

5. The touchscreen integrated display device of claim 1, further comprising:
   a conductive ball for connecting the pad electrode to the sub-pad electrode in a vertical direction; and an anisotropic conductive film filling an area between the conductive ball and another conductive ball.

6. The touchscreen integrated display device of claim 1, wherein the polarizing plate covers both the transparent organic film and the shielding film.

7. The touchscreen integrated display device of claim 6, further comprising a second adhesive layer between the polarizing plate, and the transparent organic film and the shielding film, which have a step-free surface.

8. The touchscreen integrated display device of claim 7, wherein:
the polarizing plate has a surface not facing the transparent organic film and the shielding film; and
the surface of the polarizing plate is adhered to the cover window.

9. A method for manufacturing a touchscreen integrated display device, the method comprising:
providing a first glass substrate;
providing a shielding film on the first glass substrate, the shielding film having a closed-loop shape;
providing a transparent organic film in a region inside the shielding film on the first glass substrate;
providing a sensor electrode on the transparent organic film;
providing a routing line and a pad electrode on the shielding film;
providing a display panel comprising:
providing an active area corresponding to the transparent organic film;
providing a dead area corresponding to the shielding film outside the active area; and
providing a sub-pad electrode in a region corresponding to the pad electrode in the dead area;
providing a first adhesive layer on the transparent organic film on which the sensor electrode is provided to bond the active area of the display panel to the transparent organic film;
removing the first glass substrate; and
adhering a polarizing plate to a rear surface of the transparent organic film and the shielding film.

10. The method of claim 9, further comprising, while providing the first adhesive layer to bond the active area of the display panel thereto, providing an anisotropic conductive film on the pad electrode to bond the pad electrode to the sub-pad electrode.

11. The method of claim 10, wherein a thickness of the anisotropic conductive film is larger than a thickness of the first adhesive layer.

12. The method of claim 9, wherein the preparing a first glass substrate further comprises depositing a sacrificial layer on a surface of the first glass substrate.

13. The method of claim 9, further comprising, after providing the shielding film and the transparent organic film on the first glass substrate, providing a buffer layer covering the shielding film and the transparent organic film.

14. The method of claim 9, wherein the adhering a polarizing plate to the rear surface of the transparent organic film and the shielding film is carried out by providing a second adhesive layer on the rear surface of the transparent organic film and the shielding film.

15. The method of claim 14, wherein:
the polarizing plate has a surface not facing the second adhesive layer; and
the surface of the polarizing plate is adhered to the cover window.

* * * * *